United States Patent
Ping (10) Patent No.: US 9,237,670 B2
(45) Date of Patent: Jan. 12, 2016

(54) SOCKET INTERPOSER AND COMPUTER SYSTEM USING THE SOCKET

(71) Applicant: Samsung Electronics, Ltd., Gyeonggi-do (KR)

(72) Inventor: Zhan Ping, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 142 days.

(21) Appl. No.: 14/191,395

(22) Filed: Feb. 26, 2014

(65) Prior Publication Data

US 2015/0245525 A1   Aug. 27, 2015

(51) Int. Cl.
| | |
|---|---|
| G06F 1/16 | (2006.01) |
| H05K 7/10 | (2006.01) |
| H05K 1/18 | (2006.01) |
| H05K 3/30 | (2006.01) |

(52) U.S. Cl.
CPC .. *H05K 7/10* (2013.01); *H05K 1/18* (2013.01); *H05K 3/30* (2013.01); *H05K 2201/10159* (2013.01); *H05K 2201/10325* (2013.01)

(58) Field of Classification Search
USPC ........... 365/223.18, 233.1, 51, 149, 236, 222; 365/185.05, 189.01, 230.06; 312/223.1, 312/223.2, 223.3; 165/80.3, 104.11; 439/77, 78, 485, 330, 331, 67, 74, 68, 439/507; 711/102, 103, 167, 104, 105, 154, 711/155, 143; 710/300, 301, 305, 306; 361/679.29, 679.31, 679.32, 679.47, 361/679.33, 679.54, 679.02, 679.46, 679.5, 361/679.08, 679.27, 679.21
See application file for complete search history.

(56) References Cited

U.S. PATENT DOCUMENTS

| | | | |
|---|---|---|---|
| 6,493,240 | B2 | 12/2002 | Broglia |
| 6,772,261 | B1 | 8/2004 | D'Antonio |
| 7,716,411 | B2 | 5/2010 | Panabaker |
| 7,729,126 | B2 | 6/2010 | Calhoun |
| 8,064,222 | B2 | 11/2011 | Nishio |
| 8,189,328 | B2 | 5/2012 | Kanapathippillai |
| 8,199,515 | B2 | 6/2012 | Bandholz |
| 8,279,690 | B1 | 10/2012 | Wang |
| 8,296,496 | B2 | 10/2012 | Mogul |
| 8,397,013 | B1 | 3/2013 | Rosenband |
| 2011/0153916 | A1 | 6/2011 | Chinnaswamy |
| 2012/0104543 | A1 | 5/2012 | Shahoian |
| 2012/0284436 | A1 | 11/2012 | Casper |
| 2015/0016044 | A1* | 1/2015 | Ping ................... 361/679.31 |
| 2015/0134868 | A1* | 5/2015 | Shaeffer et al. .......... 710/300 |
| 2015/0195901 | A1* | 7/2015 | Hoffmeyer et al. ...... 361/679.29 |

\* cited by examiner

*Primary Examiner* — Hung Duong
(74) *Attorney, Agent, or Firm* — Convergent Law Group LLP (57) ABSTRACT

Exemplary embodiments include a socket interposer having a first plurality of connectors, at least one of on-board memory socket and a memory. The first plurality of connectors is configured to fit with a first form factor of a memory socket on a server board. The at least one on-board memory socket includes at least a second plurality of connectors and has a second form factor configured for a memory module having a first memory type. The memory has a second memory type different from the first memory type of the memory module.

20 Claims, 5 Drawing Sheets

SOCKET INTERPOSER AND COMPUTER SYSTEM USING THE SOCKET

BACKGROUND

Modern server applications, such as data centers and server rack environments, typically use multiple server nodes that cooperate together to provide services to clients. Conventional server motherboards are typically used in such server nodes. A server motherboard includes at least a circuit board having a number of sockets configured to fit various components, one or more processors (e.g. CPUs), and an interface for performing external communication. The CPUs include connectors having a form factor that mates with CPU sockets on the circuit board. Other components may also be used. Some of these may be incorporated into the circuit board or may fit dedicated socket(s) on the circuit board. For example, memory such as dynamic random access memory (DRAM) is also provided for the server boards. The DRAM may be a module having a dual in line memory module (DIMM) form factor. The DRAM modules may thus be plugged into DIMM memory sockets on the circuit board. This memory is accessible through the CPU.

In operation, each server board performs calculations using at least its internal CPUs. DIMM modules including DRAM for each CPU may provide faster access to items in the dedicated memory. For external communication data are routed to/from their locations in memory from/to the Ethernet interface. Similarly, CPU commands, requests, and other information are routed from/to the CPU to/from the Ethernet interface. Thus, server boards may operate individually or together to provide the desired operations.

Conventional server boards may use DRAM mounted in DIMM sockets in order to provide low latency memory accesses. However, some server applications may perform better with different types of memory. For example, a particular application may be optimized for use with flash memory or a combination of DRAM and flash. However, conventional DRAM DIMM memory modules as well as other memory modules are limited in the types and amounts of memory that can be provided.

Accordingly, a server board having improved functionality and flexibility is desired.

BRIEF SUMMARY

Exemplary embodiments include a socket interposer having a first plurality of connectors, at least one of on-board memory socket and a memory. The first plurality of connectors is configured to fit with a first form factor of a memory socket on a server board. The at least one on-board memory socket includes at least a second plurality of connectors and has a second form factor configured for a memory module having a first memory type. The memory has a second memory type different from the first memory type of the memory module According to the method and system disclosed herein, the exemplary embodiments provide a mechanism for providing additional memory having a desired type. For example, DRAM and/or flash memories having the desired ratio of DRAM to flash may be provided.

DETAILED DESCRIPTION

The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. Further, although specific blocks are depicted, various functions of the blocks may be separated into different blocks or combined. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein. Reference is made in detail to the embodiments of the present general inventive concept, examples of which are illustrated in the accompanying drawings, wherein like reference numerals refer to the like elements throughout.

The embodiments are described below in order to explain the present general inventive concept while referring to the figures. The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified.

Figure 1:
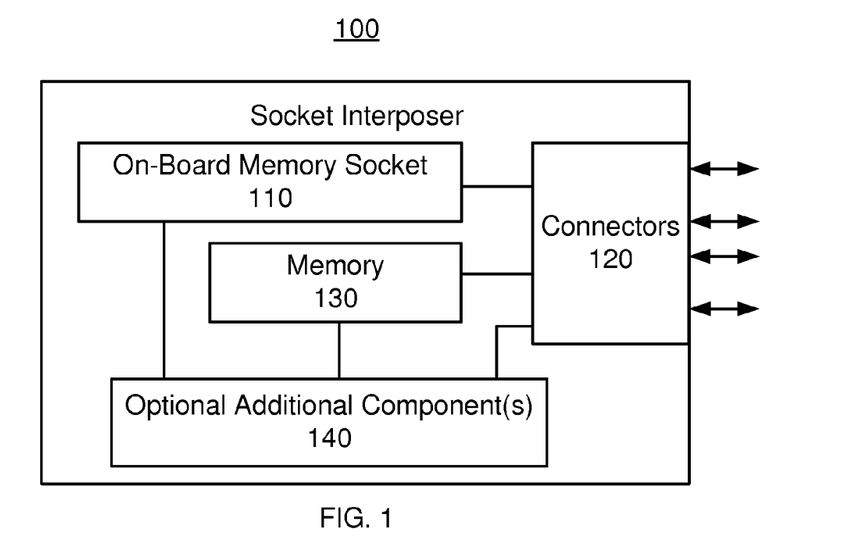
FIG. 1 is a block diagram of an exemplary embodiment of a socket interposer.
Figure 2:
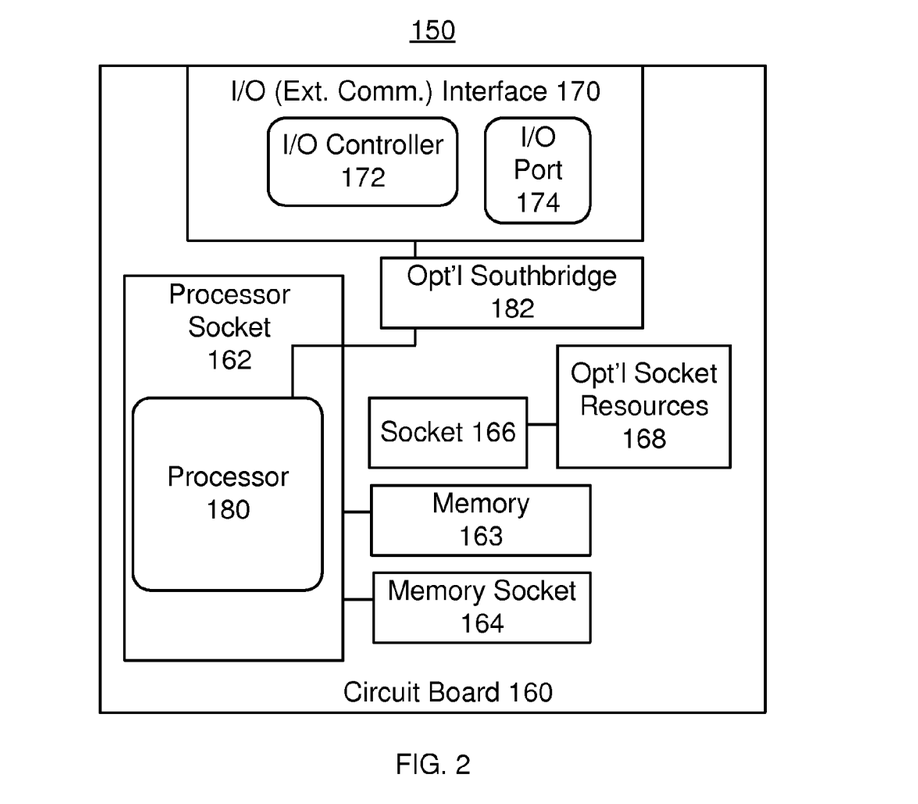
FIG. 2 is a block diagram of an exemplary embodiment of a computer system in which the exemplary embodiment socket interposer may reside.

FIG. 1 is a block diagram illustrating an exemplary embodiment of a socket interposer 100 that make take the form of a riser. FIG. 2 depicts a computer system 150 in which the socket interposer 100 may be employed. FIG. 2, therefore, depicts an exemplary embodiment of an environment in which the socket interposer 100 may operate. The computer system 150 may be a server board that may be part of a data center or other server application. In other embodiments, however, the computer system 150 may reside in another environment and/or perform other functions. The computer system 100 and thus socket interposer 100 may reside in a rack/server environment in a server farm and/or in another computing application.

Referring to FIGS. 1-2, the computer system 150 includes a circuit board 160 external communication interface 170, processor 180 and optional southbridge 182. Also shown in the computer system 150 is input/output (I/O) interface 170. Essentially, the I/O interface 170 is used for external communication. The I/O interface 170 includes I/O port(s) 174 and I/O controller 172. In some embodiments, the I/O controller 172 is an Ethernet controller. In other embodiments, other controllers using other protocols for external communication may be used.

The circuit board 160 includes sockets 162 and 164. The circuit board 166 may also include optional socket 166 that may be associated with optional socket resources 168. The socket 162 is a processor socket. The processor 180 may be a CPU and has pins (not shown in FIG. 2) having a form factor configured to fit the processor socket 162. The processor 180 may thus be plugged into the processor socket 162 for the computer system 160 to function as a server board. The circuit board 160 also includes dedicated memory 163 for the processor 180/processor socket 162. In some embodiments, dedicated memory 163 is a DIMM plugged into a DIMM slot on the circuit board 160. However, in other embodiments, the dedicated memory 163 may be provided in another manner. Further, although not shown, many server boards 150 include multiple processors residing in multiple sockets. However, for simplicity, only some of the sockets and other components are depicted in FIG. 2.

The circuit board 160 also include memory socket 164. In some embodiments, the memory socket 164 may take the place of the memory/memory socket 163. Thus, in some embodiments, the memory socket 164 may be a DIMM slot. The socket interposer 100 may be configured to fit and be plugged into the memory socket 164. Thus, the socket interposer 100 and a memory module (not shown in FIGS. 1-2) may add to or take the place of memory 163.

The socket interposer 100 includes an on-board memory socket 110, connectors 120, memory 130 and optional additional component(s) 140. The connectors 120 include a number of pins having a configuration, or form factor, configured to fit the memory socket 164 on the computer system 150. Stated differently, the socket interposer 100 may be plugged into the socket 164 and will function within the computer system 150. The socket interposer 100 also has a footprint that fits within the space provided for the memory socket. For example, if the socket 164 is a DIMM socket, then the connectors 120 of the socket interposer 100 have the same form factor as a DIMM module. In addition, the socket interposer 100 would have substantially the same footprint as a DIMM module.

The on-board memory socket 110 includes connectors (not shown in FIG. 1) as well as a form factor configured for a memory module. In some embodiments, the memory module 110 is consistent with DIMM modules. Thus, the arrangement/form factor and area provided on the socket interposer 100 would be configured to allow a DIMM module to plug into the on-board memory socket 110. The socket interposer 100 may thus include a riser for the on-board memory socket 110 that allows the socket interposer 110 and any memory module (not shown in FIGS. 1-2) to reside in the space allocated on the circuit board 160 for the memory socket 164/ module with which the memory socket 164 was originally configured to fit.

The socket interposer 100 also includes memory 130. In some embodiments, the memory 130 is of a different memory type than the memory module which is plugged into the on-board memory socket. For example, if the on-board memory socket 110 is configured for a DRAM DIMM module, then the memory 130 may be a nonvolatile memory such as a flash memory. For example, the flash memory may be a NAND memory, a NOR memory, a magnetic random access memory (MRAM), a spin-transfer torque MRAM (STT-RAM) or other memory. In contrast, if the on-board memory socket 130 is configured for use with a flash memory module, then the memory 130 may be DRAM memory. In some embodiments, the memory 130 is on-board memory. Thus, the memory 130 may be incorporated into the socket interposer 130. In such embodiments, the on-board memory 130 would not be easily altered by an end user. In other embodiments, the memory 130 may be coupled to the socket interposer 100, for example via an additional socket.

The socket interposer 100 may also include optional additional component(s) 130. The optional additional component(s) 130 may be used to extend the functionality of the socket interposer 100. For example, the optional additional component(s) may include a memory interface and/or controller or other component that allows the socket interposer 100 to be utilized by the server board 150.

The socket interposer 100 may enhance the functionality of the computer system 150. The preexisting circuit board 160 having preexisting memory socket 164 may be provided with the additional memory through the socket interposer 100. For example, a DIMM NAND flash memory having a large DRAM cache may be provided using the socket interposer 100 and a memory module. A flash memory on a DIMM may be used as a local swap space for DRAM memory using the memory 130 and a memory module coupled with the on-board socket 110. In other embodiments, a raw flash block storage may be provided along with a DRAM memory using the socket interposer 100 and an associated memory module. Thus, additional memory of various type(s) may be provided through the socket interposer 100. For example, a DRAM module may be plugged into the on-board memory socket 110. This may be the memory module that would have otherwise be plugged into the socket 164. The DRAM module may still be able to be used by the processor 180 through the socket interposer 110. In addition, the memory 130 may provide additional memory resources usable by the processor 180. For example, the all or part of the memory 130 may be flash memory. This combination of DRAM and flash may improve the latency and other aspects of performance of the processor 180 and/or computer system 150 while providing nonvolatile storage. Further, the amount of flash provided in the memory 130 may be adjusted to have a desired ratio of DRAM to flash memory. This may be accomplished by providing on-board memories of various sizes or by using a combination of a socket and plug-in memory modules having various sizes for the memory 130. Thus, a hybrid memory having the desired memory ratio may be provided. Performance of the computer system 150 may be further improved.

Alternatively, a flash memory module may be connected to the on-board memory socket 110. Other memory, such as a DRAM or flash may make up or be part of the memory 130. Thus, a hybrid memory may be provided through the use of the socket interposer 100. In other embodiments, the same type of memory may be in the module connected to the on-board socket interposer 100. Further, the socket interposer 100 may be used in the dedicated memory socket for the memory 163. The memory 163 may also be plugged into the on-board memory socket 110. The memory 163 and the memory 130 may both be provided for the processor 180. Thus, additional memory resources may be made available to the computer system 150 and performance of the computer system 150 improved.

FIGS. 3-6 depict various embodiments of socket interposers and computer systems in which the socket interposers may reside that are analogous to the socket interposer 100 and computer system 150, respectively. Analogous components in FIGS. 3-6 are thus labeled similarly to those in FIGS. 1 and 2.

Figure 3:
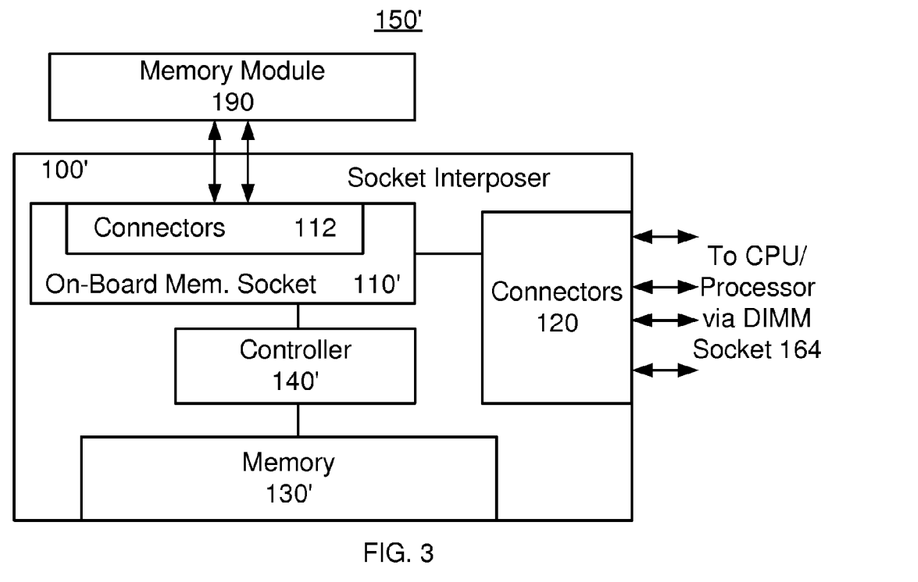
FIG. 3 is a block diagram of another exemplary embodiment of a socket interposer as used in a computer system.

FIG. 3 is a block diagram illustrating an exemplary embodiment of a socket interposer 100' as used in a computer system 150'. For clarity, only the socket interposer 100' and a portion of the computer system 150' are shown. The computer system 150' may be a server board that may be part of a data center or other server application. Thus, in the context of FIG. 3, the computer system 150' is described as server board 150'. In other embodiments, however, the server board 150' may reside in another environment and/or perform other functions. For clarity, only the socket interposer 100' and memory module 190 are shown. The memory module 190 may be the memory 163 or may be another module. For example, a DRAM or other DIMM module may be used for the memory module 190.

The socket interposer 100' includes an on-board memory socket 110', connectors 120, memory 130' and controller 140' that are analogous to the on-board memory socket 110, connectors 120, memory 130 and components 140, respectively. The on-board memory socket 110' includes connectors 112. The connectors 112 include a number of pins having a configuration, or form factor, configured to fit the memory module 190 for the computer system 150'. For example, the memory module 190 may be a DRAM DIMM module, a flash memory module or other memory. Thus, the footprint and form factor of the on-board memory socket 110' and the configuration of the connectors 112 are for the memory module 190. For example, if the memory module 190 is a DRAM DIMM, aspects of the on-board memory socket 110' such as the footprint and the connectors 112 would configured such that the DRAM DIMM may be plugged into the socket.

The connectors 120 are configured in a manner discussed above. Thus, the socket interposer 150' may be plugged into the memory socket 164 on the computer system 150. The socket interposer 100' also includes memory 130'. In some embodiments, the memory 130' is of a different memory type than the memory module which is plugged into the on-board memory socket. For example, if the on-board memory socket 110' is configured for a DRAM DIMM module, then the memory 130' may be a flash memory. For example, the flash memory may be a NAND memory, a NOR memory, a magnetic random access memory (MRAM), a spin-transfer torque MRAM (STT-RAM) or other memory. In contrast, if the on-board memory socket 130 is configured for use with a flash memory module, then the memory 130' may be DRAM memory. In some embodiments, the memory 130' is on-board memory. In other embodiments, the memory 130' may be coupled to the socket interposer 100', for example via an additional socket.

Also included in the socket interposer 100' may be a memory controller 140'. The memory controller 140' is connected to the memory 130' as well as the on-board memory socket 110'. Although the memory controller 140' is shown as being directly connected to components 110' and 130', in other embodiments, the components 110' and 130' may be coupled via other components (not shown). The contents of the memory 130 and memory module 190 may thus be managed. Stated differently, data may be written to and retrieved from the memory module 190 and/or the memory 130'.

The socket interposer 100' may enhance the functionality of the computer system 150' by providing various type(s) of additional memory. For example, a hybrid memory including both nonvolatile and volatile storage may be provided. For example, a DRAM module may be plugged into the on-board memory socket 110'. This may be the memory module that would have otherwise be plugged into the socket 164. The DRAM module may still be able to be used by the processor 180 through the socket interposer 110'. In addition, the memory 130' may provide additional memory resources usable by the processor 180. At least some of these memory resources may be flash memory or another type of nonvolatile storage. This combination of DRAM and flash may improve the latency and other aspects of performance of the processor 180 and/or computer system 150' while providing nonvolatile storage. Further, the amount of flash provided in the memory 130' may be adjusted to have a desired ratio of DRAM to flash memory. This may be accomplished by providing on-board memories of various sizes or by using a combination of a socket and plug-in memory modules having various sizes for the memory 130'. Alternatively, flash memory may be provided via the memory module 190 and DRAM provided through the memory 130'. Thus, a hybrid memory having the desired memory ratio may be provided. Performance of the computer system 150 may be further improved.

Figure 4:
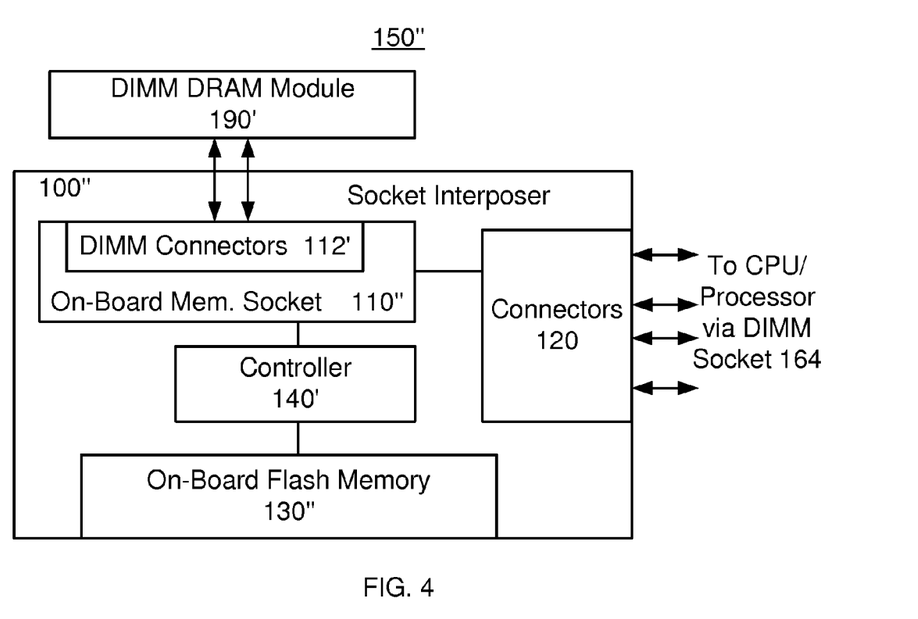
FIG. 4 is a block diagram of another exemplary embodiment of a socket interposer as used in a computer system.

FIG. 4 is a block diagram illustrating an exemplary embodiment of a socket interposer 100" as used in a computer system 150". For clarity, only the socket interposer 100" and a portion of the computer system 150" are shown. The computer system 150" may be a server board that may be part of a data center or other server application. Thus, in the context of FIG. 4, the computer system 150" is described as server board 150". In other embodiments, however, the server board 150" may reside in another environment and/or perform other functions. For clarity, only the socket interposer 100" and memory module 190' are shown. The memory module 190' may be the memory 163 or may be another module. In the embodiment shown, a DRAM DIMM is used for the memory module 190'.

The socket interposer 100" includes an on-board memory socket 110", connectors 120, on-board flash memory 130" and controller 140' that are analogous to the on-board memory socket 110/110', connectors 120, memory 130/130' and components 140/controller 140', respectively. The on-board memory socket 110" includes connectors 112' analogous to the connectors 112. The connectors 112' include a number of pins having a configuration, or form factor, configured to fit the DRAM DIMM 190' for the computer system 150". Thus, the footprint and form factor of the on-board memory socket 110" as well as the number and configuration of the connectors 112' are for the DRAM DIMM 190'.

The connectors 120 are configured in a manner discussed above. Thus, the socket interposer 100" may be plugged into the memory socket 164 on the computer system 150. The socket interposer 100" also includes on-board flash memory 130". In this embodiment, the on-board flash memory 130" is of a different memory type than the DRAM DIMM module 190' which is plugged into the on-board memory socket 110". In some embodiments, the on-board flash memory 130" may be a NAND memory, a NOR memory, a magnetic random access memory (MRAM), a spin-transfer torque MRAM (STT-RAM) or other memory.

Also included in the socket interposer 100" is a memory controller 140'. The memory controller 140' is connected to the on-board flash memory 130" as well as the on-board memory socket 110". Although the memory controller 140' is shown as being directly connected to components 110" and 130", in other embodiments, the components 110" and 130" may be coupled via other components (not shown). The contents of the memory 130" and memory module 190' may thus be managed. Stated differently, data may be written to and retrieved from the memory module 190' and/or the memory 130".

The socket interposer 100" may enhance the functionality of the computer system 150" by providing a hybrid of flash memory and DRAM. The amount of flash provided in the memory 130" may be adjusted to have a desired ratio of DRAM to flash memory. Performance of the computer system 150" may be further improved.

Figure 5:
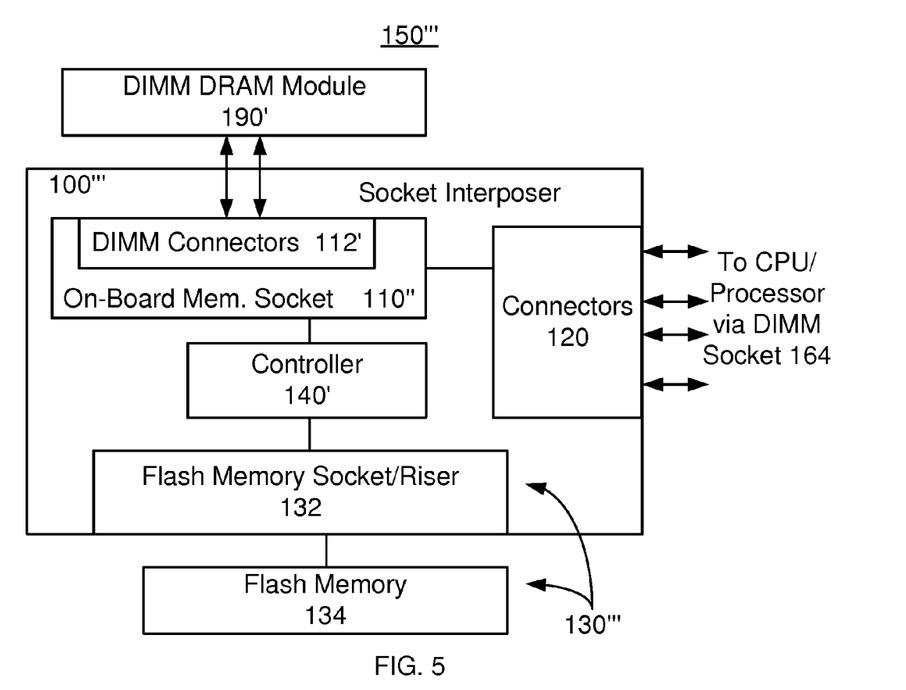
FIG. 5 is a block diagram of another exemplary embodiment of a socket interposer as used in a computer system.

FIG. 5 is a block diagram illustrating an exemplary embodiment of a socket interposer 100''' as used in a computer system 150'''. For clarity, only the socket interposer 100''' and a portion of the computer system 150''' are shown. The computer system 150''' may be a server board that may be part of a data center or other server application. Thus, in the context of FIG. 5, the computer system 150''' is described as server board 150'''. In other embodiments, however, the server board 150''' may reside in another environment and/or perform other functions. For clarity, only the socket interposer 100''' and memory module 190' are shown. The memory module 190' may be the memory 163 or may be another module. In the embodiment shown, a DRAM DIMM is used for the memory module 190'.

The socket interposer 100''' includes an on-board memory socket 110", connectors 120, memory 130''' and controller 140' that are analogous to the on-board memory socket 110/110'/110", connectors 120, memory 130/130' and components 140/controller 140', respectively. The on-board memory socket 110" is analogous to the on-board memory socket 110" depicted in FIG. 4. The socket 110" thus includes connectors 112' analogous to the connectors 112/112'. The connectors 112' include a number of pins having a configuration, or form factor, configured to fit the DRAM DIMM 190'. Thus, the footprint and form factor of the on-board memory socket 110" as well as the number and configuration of the connectors 112' are for the DRAM DIMM 190'.

The connectors 120 are configured in a manner discussed above. Thus, the socket interposer 100" may be plugged into the memory socket 164 on the computer system 150. The socket interposer 100" also includes memory 130". The memory 130" is a flash memory. In this embodiment, the flash memory 130''' is of a different memory type than the DRAM DIMM module 190' which is plugged into the on-board memory socket 110". Further, the memory 130''' includes a socket or riser 132 and a memory module 134 that plugs into the socket 132. The memory module 134 may be a flash module. For example, the flash memory module 134 may be a NAND memory, a NOR memory, a magnetic random access memory (MRAM), a spin-transfer torque MRAM (STT-RAM) or other memory.

Also included in the socket interposer 100''' is a memory controller 140'. The memory controller 140' is connected to the memory 130''' as well as the on-board memory socket 110". Although the memory controller 140' is shown as being directly connected to components 110" and 130''', in other embodiments, the components 110" and 130''' may be coupled via other components (not shown). The contents of the memory 130''' and memory module 190' may thus be managed. Stated differently, data may be written to and retrieved from the memory module 190' and/or the memory 130".

The socket interposer 100''' may enhance the functionality of the computer system 150''' by providing a hybrid of flash memory and DRAM. The amount of flash provided in the memory 134 may be adjusted to have a desired ratio of DRAM to flash memory. This may be more easily accomplished because different flash memory modules 134 may be plugged into the socket. Performance of the computer system 150''' may be further improved.

Figure 6:
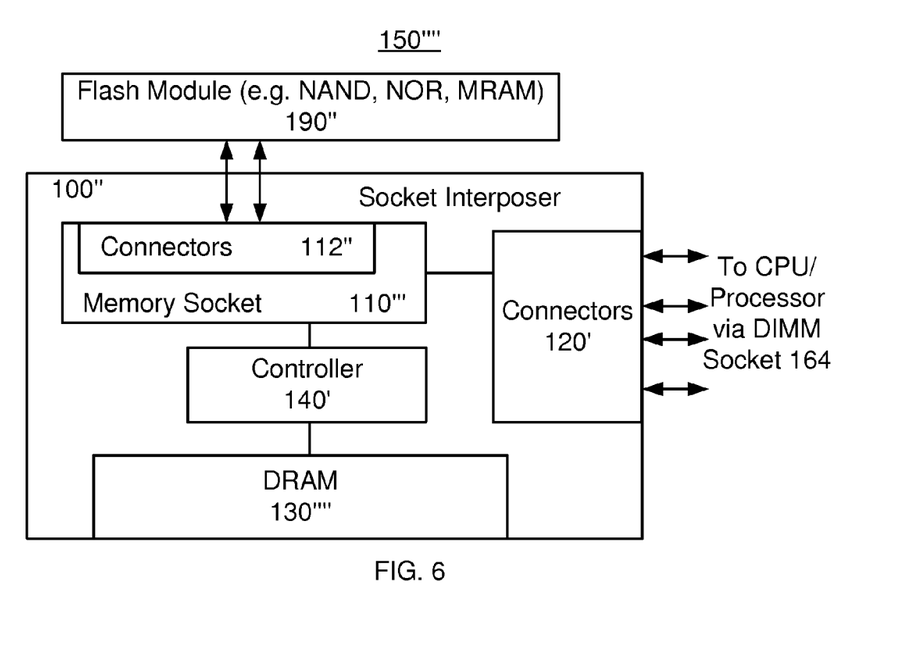
FIG. 6 is a block diagram of another exemplary embodiment of a socket interposer as used in a computer system.

FIG. 6 is a block diagram illustrating an exemplary embodiment of a socket interposer 100'''' as used in a computer system 150''''. For clarity, only the socket interposer 100'''' and a portion of the computer system 150'''' are shown. The computer system 150'''' may be a server board that may be part of a data center or other server application. Thus, in the context of FIG. 6, the computer system 150'''' is described as server board 150''''. In other embodiments, however, the server board 150''' may reside in another environment and/or perform other functions. For clarity, only the socket interposer 100''' and memory module 190' are shown. The memory module 190" may be the memory 163 or may be another module. In the embodiment shown, a flash memory module 190" is used. The flash module 190" may have a DIMM or other configuration.

The socket interposer 100'''' includes an on-board memory socket 110''', connectors 120, memory 130'''' and controller 140' that are analogous to the on-board memory socket 110/110'/110", connectors 120, memory 130/130' and components 140/controller 140', respectively. The on-board memory socket 110''' is analogous to the on-board memory sockets 110/110'/110". The socket 110''' thus includes connectors 112" analogous to the connectors 112/112'. The connectors 112" include a number of pins having a configuration, or form factor, configured to fit the flash memory module 190". Thus, the footprint and form factor of the on-board memory socket 110''' as well as the number and configuration of the connectors 112" are for the flash module 190".

The connectors 120 are configured in a manner discussed above. Thus, the socket interposer 100'''' may be plugged into the memory socket 164 on the computer system 150. The socket interposer 100'''' also includes memory 130''''. The memory 130'''' is a DRAM memory. In this embodiment, the DRAM 130'''' is of a different memory type than the flash module 190" which is plugged into the on-board memory socket 110'''. In some embodiments, the DRAM 130'''' is on-board memory. In other embodiments, the DRAM 130'''' may include a socket and memory module such as a DRAM DIMM in a manner analogous to the memory 130''', socket 132 and memory module 134.

Also included in the socket interposer 100'''' is a memory controller 140'. The memory controller 140' is connected to the memory 130'''' as well as the on-board memory socket 110'''. Although the memory controller 140' is shown as being directly connected to components 110''' and 130'''', in other embodiments, the components 110''' and 130'''' may be coupled via other components (not shown). The contents of the memory 130'''' and memory module 190" may thus be managed. Stated differently, data may be written to and retrieved from the memory module 190" and/or the memory 130"".

The socket interposer 100"" may enhance the functionality of the computer system 150''' by providing a hybrid of flash memory and DRAM. The amount of flash provided in the memory 134 may be adjusted to have a desired ratio of DRAM to flash memory. Performance of the computer system 150''' may be further improved.

Figure 7:
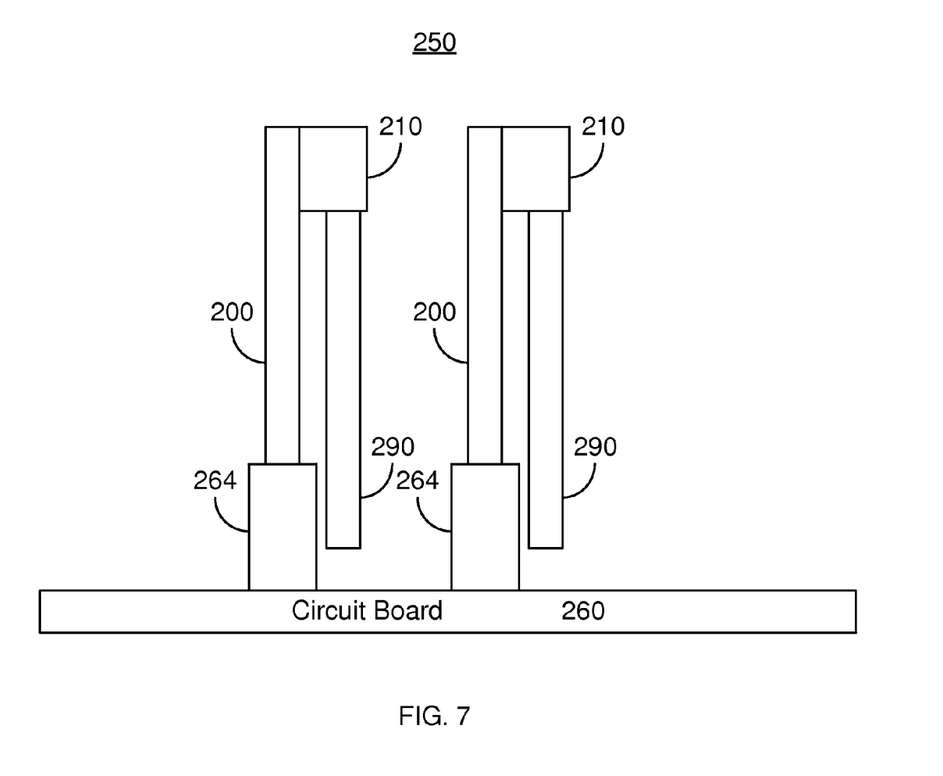
FIG. 7 is a side view of another exemplary embodiment of a socket interposer as used in a computer system.

FIG. 7 is a side view of another exemplary embodiment of socket interposers 200 as used in a computer system 250. For clarity, two the socket interposer 200 and a portion of the computer system 250 are shown. The socket interposer 200 and computer system 250 may be analogous to the socket interposer(s) 100, 100', 100", 100''' and/or 100"" and to the computer systems 150, 150', 150", 150''' and/or 150"", respectively. Thus, the socket interposer 200 is shown as including an on-board memory socket 210 and being connected to a memory module 290 that are analogous to the memory sockets 10, 110', 110" and/or 110''' and memory modules 190, 190' and/or 190", respectively. Similarly, the computer system 250 includes circuit board 160 and sockets 264 that are analogous to the circuit board 160 and memory socket 164, respectively. For simplicity, not all portions of the socket interposer 200 and computer system 250 are shown. The memory module 190" may be the memory 163 or may be another module. In the embodiment shown, a flash memory module 190" is used. The flash module 190" may have a DIMM or other configuration.

In the embodiment shown, the memory sockets 264 may be DIMM sockets. The socket interposer 200 may include a memory (not shown) such as a flash memory, dram or other memory described herein. The memory includes an on-board memory socket 210 that includes connectors (not shown in FIG. 7) configured to fit the form factor and footprint of the memory module 290. In some embodiments, the memory module 290 is a DIMM module. For example, the memory module(s) 290 may be a DIMM DRAM or other memory. Thus, the on-board memory socket 210 may be a DIMM socket. The components of the socket interposer 200 and computer system 250 may be configured as described above.

In addition, as can be seen in FIG. 7, the on-board memory sockets 290 are configured upside down. As a result, the DIMM module 290 may be placed upside down and in parallel with the socket interposer 200.

The socket interposer 200 may enhance the functionality of the computer system 250 by providing additional memory. For example, a hybrid of flash memory and DRAM may be provided through memory (not shown) on board the socket interposer 200 and the DIMM module 290. Performance of the computer system 250 may be further improved. Further, because of the orientation of the DIMM modules 290, space may be saved and the height requirements for the computer system 250 may be met. However, improved thermal dissipation near the modules 290 may be desired.

Figure 8:
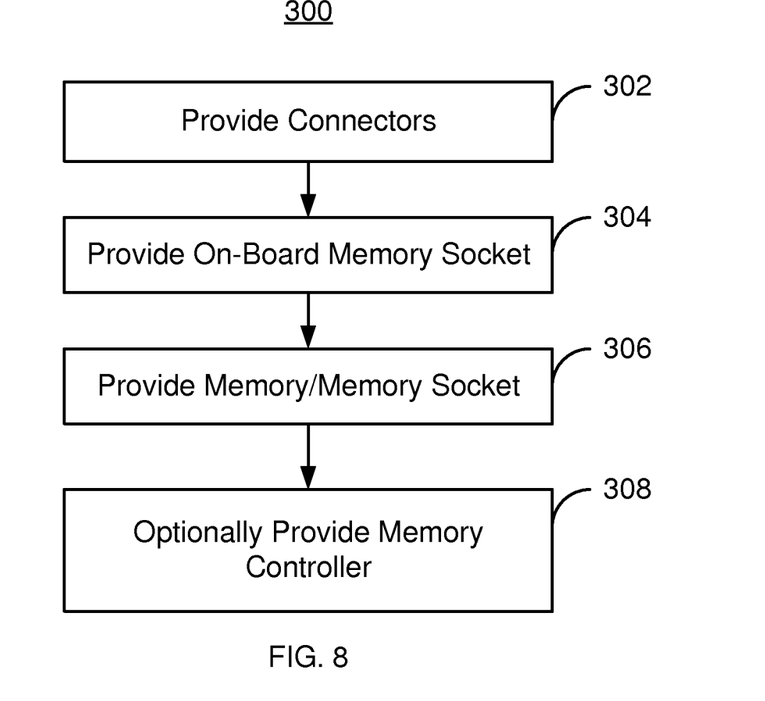
FIG. 8 is a flow chart depicting an exemplary embodiment of a method for providing a socket interposer.

FIG. 8 is a flow chart depicting an exemplary embodiment of a method 300 for fabricating a socket interposer such as the socket interposer 100, 100', 100", 100''', 100"" and/or 200. For simplicity, some steps may be omitted or combined. The method 300 is described in the context of the socket interposer 100. However, the method 300 may be used for other socket interposers.

The connectors 120 are provided, via step 302. Step 302 may include configuring the connectors to have the desired form factor. For example, the connectors 120 may be configured for a memory socket such as a DIMM Socket. The on-board memory socket 110 is provided, via step 304. Step 304 includes allocating an area or providing a riser sufficient for the footprint of the desired memory module, such as a DRAM DIMM module. The connectors, such as the connectors 112/112'/112" may also be configured to have the desired form factor. For example, the number and location of the connectors 112/112'/112" may be configured for a DIMM socket. The memory 130 is provided in step 306. In some embodiments, step 306 includes providing an on-board memory. In other embodiments, step 306 may include providing another socket into which a memory module can be plugged. The memory controller 140' and/or other additional components may be provided, via step 308. Thus, the desired socket interposer may be fabricated.

Using the method 300, the socket interposer 100, 100', 100", 100''', 100"" and/or an analogous socket interposer may be provided. Thus, one or more of the benefits described herein may be achieved.

Figure 9:
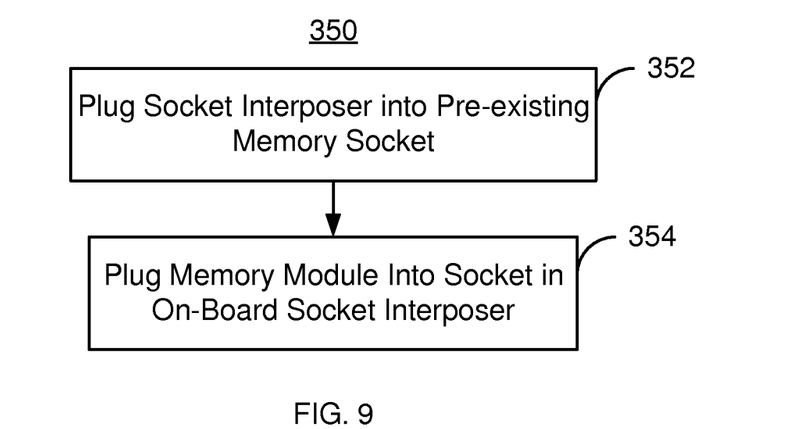
FIG. 9 is a flow chart depicting an exemplary embodiment of a method for using a socket interposer.

FIG. 9 is a flow chart depicting an exemplary embodiment of a method 350 for using a socket interposer such as the socket interposer 100, 100', 100", 100''', 100"" and/or 200. For simplicity, some steps may be omitted or combined. The method 350 is described in the context of the socket interposer 100 and computer system 150. However, the method 350 may be used for other socket interposers and/or other computer systems.

The socket interposer 100 is plugged into the appropriate, preexisting socket 164 of the computer system 150, via step 352. The socket interposer 100 is thus plugged into a socket designed and fabricated for a memory component. In some embodiments, the socket interposer may be plugged into the socket for the memory 163. The desired memory module is also plugged into the on-board socket 110 in the socket interposer, via step 354. The computer system 150, or server board, may then be used with the socket interposer 100 in place.

Using the method 350, the socket interposer 100, 100', 100", 100''', 100"", 200 and/or an analogous socket interposer may be connected with the desired computer system 150, 150', 150", 150''', 150"", 250 and/or analogous computer system. Thus, the computer system may enjoy better function and/or performance. For example, the latency of communication may be reduced and/or the memory resource available may be enhanced. As a result, performance of the computer system may be improved.

A method and system for a socket interposer has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

I claim:

1. A socket interposer comprising:
   a first plurality of connectors configured to fit with a first form factor of a memory socket on a server board;
   at least one on-board memory socket including a second plurality of connectors configured to fit a second form factor for a memory module having a first memory type; and
   a memory having a second memory type different from the first memory type.

2. The socket interposer of claim 1 wherein the first memory type is a dynamic random access memory and the memory is a flash memory.

3. The socket interposer of claim 2 wherein the second memory type is flash.

4. The socket interposer of claim 1 wherein the first memory type is a flash memory and the second memory type is dynamic random access memory.

5. The socket interposer of claim 1 wherein the memory module is a dual in line memory module (DIMM) including a plurality of dynamic random access memory components.

6. The socket interposer of claim 5 wherein the memory socket is a DIMM socket.

7. The socket interposer of claim 1 further comprising:
a memory controller coupled with the first plurality of connectors, the at least the second plurality of connectors and the memory.

8. The socket interposer of claim 1 wherein the memory is on-board memory integrated into the socket interposer.

9. The socket interposer of claim 1 wherein the memory includes at least one of magnetic random access memory and spin transfer torque magnetic random access memory.

10. A computer system comprising:
a circuit board including at least one processor socket having a processor form factor and at least one memory socket having a first form factor for a first memory module having a first memory type;
at least one processor having the processor form factor and coupled with the at least one processor socket; and
at least one socket interposer, each of the at least one socket interposer a first plurality of connectors, at least one on-board memory socket and at least one memory, the first plurality of connectors being configured to fit with the first form factor of the at least one memory socket on the server board, the at least one on-board memory socket including a second plurality of connectors configured to fit a second form factor for a second memory module having a second memory type, the memory having a third memory type different from the second memory type.

11. The computer system of claim 10 wherein the first memory type is a dynamic random access memory (DRAM), the second memory type is the DRAM and the memory is a flash memory.

12. The computer system of claim 10 wherein the first memory type is the same as the second memory type.

13. The computer system of claim 10 wherein the third memory type is a flash memory, the first memory type is dynamic random access memory (DRAM) and the second memory type is DRAM.

14. The computer system of claim 10 wherein the first memory module is a dual in line memory module (DIMM) including a plurality of dynamic random access memory components.

15. The computer system of claim 14 wherein the at least one memory socket is at least one DIMM socket.

16. The computer system of claim 10 wherein the socket interposer further includes:
a memory controller coupled with the first plurality of connectors, the at least the second plurality of connectors and the at least one memory.

17. The computer system of claim 10 wherein the memory is integrated into the socket interposer.

18. The computer system of claim 10 wherein the memory includes at least one of magnetic random access memory and spin transfer torque magnetic random access memory.

19. The computer system of claim 10 further comprising:
at least one dual in line memory module (DIMM) connected to the at least the first plurality of connectors, the DIMM including dynamic random access memory.

20. A method for providing a computer system comprising:
plugging a socket interposer into a memory socket of a circuit board of the computer system, the socket interposer including a first plurality of connectors, at least one on-board socket and at least one memory, the first plurality of connectors configured to fit with a first form factor of a memory socket on a server board, the at least one on-board socket including at least the second plurality of connectors configured to fit a second form factor for a memory module having a first memory type, the memory having a second memory type different from the first memory type; and
plugging the memory module into the at least one on-board socket.

* * * * *